United States Patent
Kim et al.

(10) Patent No.: US 9,947,742 B2
(45) Date of Patent: Apr. 17, 2018

(54) POWER SEMICONDUCTOR DEVICE

(71) Applicant: FAIRCHILD KOREA SEMICONDUCTOR LTD., Bucheon-si (KR)

(72) Inventors: Hye-mi Kim, Bucheon-si (KR); Sun-hak Lee, Anyang-si (KR)

(73) Assignee: Fairchild Korea Semiconductor Ltd., Bucheon-si (KR)

( * ) Notice: Subject to any disclaimer, the term of this patent is extended or adjusted under 35 U.S.C. 154(b) by 0 days.

(21) Appl. No.: 15/337,748

(22) Filed: Oct. 28, 2016

(65) Prior Publication Data

US 2017/0148873 A1 May 25, 2017

(30) Foreign Application Priority Data

Nov. 23, 2015 (KR) .................. 10-2015-0163987

(51) Int. Cl.
| | |
|---|---|
| *H01L 29/06* | (2006.01) |
| *H01L 27/08* | (2006.01) |
| *H01L 29/861* | (2006.01) |
| *H01L 29/40* | (2006.01) |
| *H01L 29/66* | (2006.01) |
| H01L 27/06 | (2006.01) |

(52) U.S. Cl.
CPC ........ *H01L 29/0642* (2013.01); *H01L 29/402* (2013.01); *H01L 29/66136* (2013.01); *H01L 29/861* (2013.01); *H01L 27/0629* (2013.01)

(58) Field of Classification Search
CPC ............. H01L 29/1095; H01L 27/0266; H01L 29/0696; H01L 29/7395
See application file for complete search history.

(56) References Cited

U.S. PATENT DOCUMENTS

| | | | |
|---|---|---|---|
| 4,494,134 A | 1/1985 | Wildi et al. | |
| 5,412,234 A | 5/1995 | Schoofs et al. | |
| 7,064,407 B1 | 6/2006 | Mallikarjunaswamy | |
| 7,745,845 B2 * | 6/2010 | Cai | ................ H01L 29/10 257/119 |
| 7,928,509 B2 | 4/2011 | Huang | |
| 2010/0295101 A1 | 11/2010 | Huang | |
| 2010/0314710 A1 * | 12/2010 | Yamaji | ................ H01L 24/05 257/501 |
| 2013/0248947 A1 * | 9/2013 | Kim | ................ H01L 27/0727 257/272 |

FOREIGN PATENT DOCUMENTS

WO 2001059846 A1 8/2001

* cited by examiner

*Primary Examiner* — Roy Potter
(74) *Attorney, Agent, or Firm* — Brake Hughes Bellermann LLP

(57) ABSTRACT

A power semiconductor device includes: a substrate; an anode electrode and a cathode electrode disposed on the substrate; a well region disposed inside the substrate in a lower portion of the anode electrode, and having p-type conductivity; an NISO region disposed in a lower portion of the well region inside the substrate, and having a first n-type impurity concentration; and an n-type buried layer disposed in a lower portion of the NISO region, and having a second impurity concentration greater than the first n-type impurity concentration, inside the substrate.

20 Claims, 16 Drawing Sheets

POWER SEMICONDUCTOR DEVICE

TECHNICAL FIELD

The technical idea of the present invention relates to a power semiconductor device, more particularly, to a power semiconductor device including a bootstrap diode.

BACKGROUND

A high-voltage integrated circuit in which one or more high-voltage transistors are disposed on the same chip with low-voltage circuits, is widely used in a power control system, for example, a switching power supply or a motor driver.

A bootstrap diode can be integrated on a high-voltage integrated circuit in a monolithic fashion, however these known integrated circuits have an undesirable, significant amount of a leakage current that flows from an anode to a substrate in a conductive state.

In order to solve this problem, two chips can be disposed inside one package, or a synchronous rectifier including a separate charge pump block can be used.

However, since a separate die and package, or a separate charge pump block are used, the size of the entire module is increased, and/or manufacturing costs are increased in an undesirable fashion.

SUMMARY

An aspect of the present implementations may provide a power semiconductor device including a bootstrap diode inside.

Another aspect of the present implementations may provide a power semiconductor device in which a leakage current is reduced.

To achieve at least the above implementations, a power semiconductor device according to an aspect can include: a substrate; an anode electrode and a cathode electrode disposed at a distance away from each other on the substrate; a well region disposed inside the substrate below the anode electrode, and having p-type conductivity; an NISO region disposed below the well region, and having a first n-type impurity concentration inside the substrate; and an n-type buried layer disposed below the NISO region, and having a second impurity concentration greater than the first n-type impurity concentration inside the substrate.

According to an aspect, the well region and the NISO region may include a p-n junction diode.

According to an aspect, the n-type buried layer may be disposed below substantially the entirety of the NISO region.

According to an aspect, at least a portion of a bottom surface of the NISO region may be in contact with an upper surface of the n-type buried layer.

According to an aspect, inside the substrate, an n-type barrier layer disposed on one side of the NISO region, may be further included.

According to an aspect, the n-type barrier layer may be disposed on the n-type buried layer.

According to an aspect, at least a portion of a bottom surface of the n-type barrier layer may be in contact with an upper surface of the n-type buried layer.

According to an aspect, the n-type barrier layer may have a third n-type impurity concentration greater than the first n-type impurity concentration.

According to an aspect, inside the substrate, an n-type sink disposed on the n-type barrier layer may be further included, and the n-type sink may have a fourth n-type impurity concentration greater than the first n-type impurity concentration.

According to an aspect, inside the substrate, an element isolation region disposed on one side of the NISO region may be further included, and the element isolation region may include an upper element isolation layer and a lower element isolation layer disposed below the upper element isolation layer.

According to an aspect, a bottom surface of the lower element isolation layer may be located at a higher level than a bottom surface of the n-type buried layer.

According to an aspect, on the substrate, a ground electrode disposed on the element isolation region may be further included.

According to an aspect, the substrate may include a base substrate, a first semiconductor layer disposed on the base substrate, and a second semiconductor layer disposed on the first semiconductor layer.

According to an aspect, a first portion of the n-type buried layer may be located inside the base substrate, and a second portion of the n-type buried layer may be located inside the first semiconductor layer.

According to an aspect, the well region may be located inside the second semiconductor layer.

According to an aspect, an upper surface of the NISO region may be located on a higher level than an upper surface of the first semiconductor layer.

To achieve at least the above implementations, a power semiconductor device according to an aspect can include: a base substrate; a first semiconductor layer disposed on the base substrate; a second semiconductor layer disposed on the first semiconductor layer; an anode electrode and a cathode electrode disposed on the second semiconductor layer; a p-type well region disposed below the anode electrode inside the second semiconductor layer; an NISO region disposed below the p-type well, and in which at least a portion is located inside the first semiconductor layer; and an n-type buried layer disposed below the NISO region, and in which at least a portion is located inside the base substrate.

According to an aspect, the NISO region may have a first n-type impurity concentration, and the n-type buried layer may have a second n-type impurity concentration greater than the first n-type impurity concentration.

According to an aspect, on the n-type buried layer, an n-type barrier layer disposed on one side of the NISO region may be further included.

According to an aspect, the NISO region may have a first n-type impurity concentration, and the n-type barrier layer may have a third n-type impurity concentration greater than the first n-type impurity concentration.

According to an aspect, an element isolation region disposed on one side of the NISO region is further included, and the element isolation region may include a lower element isolation layer in which at least a portion is located inside the first semiconductor layer, and an upper element isolation layer in which at least a portion is located inside the second semiconductor layer, and on the lower element isolation layer.

To achieve at least the above implementations, a power semiconductor device according to an aspect can include: a substrate; and a plurality of unit cells disposed on the substrate. Each of the plurality of unit cells includes: an anode electrode and a cathode electrode disposed on the substrate; a well region disposed inside the substrate below the anode electrode, and having p-type conductivity; an NISO region disposed below the well region inside the substrate, and having a first n-type impurity concentration; and an n-type buried layer disposed below the NISO region, and having a second impurity concentration greater than the first n-type impurity concentration, inside the substrate.

According to an aspect, the cathode electrode inside one unit cell among the plurality of unit cells may be connected to the cathode electrode inside a unit cell adjacent thereto.

According to an aspect, the n-type buried layer may be disposed to be overlapped with substantially the entire area of the plurality of unit cells.

According to an aspect, each of the plurality of unit cells may further include an n-type barrier layer disposed on both sides of the NISO region on the n-type buried layer.

DETAILED DESCRIPTION

In order to fully understand the configurations and effects of the embodiments described herein, the embodiments are described with reference to the accompanying drawings. However, the embodiments are not limited to the embodiments set forth herein, it can be implemented in various forms and subjected to various changes. Simply, descriptions of the embodiments are provided to inform those skilled in the art of the scope of the embodiments. In the accompanying drawings, the size of components can be illustrated to be enlarged more than an actual size of the components for convenience of the description, and a proportion of respective components can be exaggerated or reduced.

It will be understood that when one element is described as being "on" or "in contact with" another element, it can be directly "on," "connected to," the other element, or other elements intervening therebetween may be present. In contrast, it will be understood that when an element is referred to as being "directly on," "directly connected to," another element, there may be no elements intervening therebetween. Other expressions used to describe the relationship between elements, for example, "between" and also "directly between" can be similarly understood.

The terms first, second, etc. can be used to describe various elements, but the above elements shall not be limited by the above terms. These terms are only used to distinguish one element, from another element. For example, without departing from the scope of the invention, a first element could be termed a second element, and similarly a second element could be termed a first element.

The singular form is intended to include the plural form as well, unless the context clearly indicates otherwise. The term "comprises," or "includes" or the like is intended to specify the presence of stated features, integers, steps, operations, members, elements, and/or groups thereof, and it will be further understood that one or more of other features, integers, steps, operations, members, elements, and/or groups thereof, and addition thereof are possible.

Unless otherwise defined, the terms used in the embodiments of the present invention can be interpreted to those of ordinary skill in the art as a conventionally known means.

Hereinafter, with reference to the accompanying drawings, the present embodiments will be described in detail.

Figure 1:
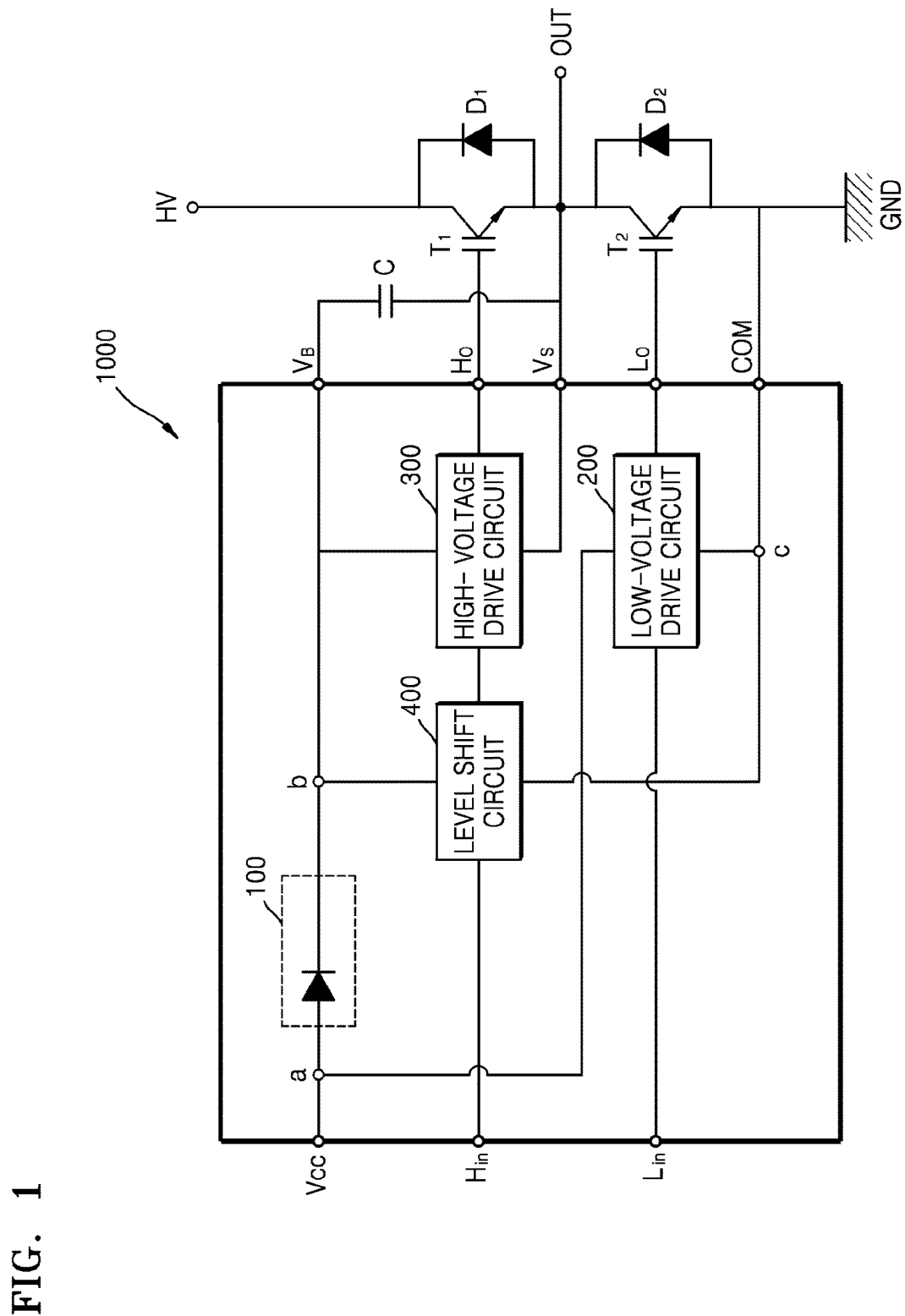
FIG. 1 is an equivalent circuit diagram of a power semiconductor device according to the exemplary embodiments.

FIG. 1 is an equivalent circuit diagram of a power semiconductor device according to the exemplary embodiments.

With reference to FIG. 1, the power semiconductor device 1000 may include a bootstrap drive circuit 100, a low-voltage drive circuit 200, a high-voltage drive circuit 300, and a level shift circuit 400. A bootstrap capacitor C may be connected to power terminals $V_B$ and $V_S$ providing power for the high-voltage drive circuit 300 in parallel. An output terminal $H_O$ may be connected to a gate of the first power transistor $T_1$ of the high-voltage drive circuit 300, and the first power transistor $T_1$ may be connected to a first diode $D_1$ in parallel. A collector of the first power transistor $T_1$ may be connected to a high-voltage HV, the first power transistor $T_1$ and the second power transistor $T_2$ may be connected in series, and an emitter of the second power transistor $T_2$ may be connected to a ground GND. The first power transistor $T_1$ and/or the second power transistor $T_2$ may include, for example, an insulted gate bipolar junction transistor (IGBT), a bipolar junction transistor (BJT), a metal oxide semiconductor field effect transistor (MOSFET), and the like.

The low-voltage drive circuit 200 outputs a low-voltage control signal to a low-voltage output terminal $L_O$ according to a signal input through a low-voltage input terminal $L_{in}$, thereby controlling the second power transistor $T_2$. The low-voltage drive circuit 200 may be operated by receiving power by a potential difference of a common terminal COM, for example, a ground voltage and a driving power $V_{CC}$.

The high-voltage drive circuit 300 outputs a high-voltage control signal to a high-voltage control terminal $H_O$ in response to a signal provided from a level shift circuit 400, thereby controlling the first power transistor $T_1$. The high-voltage drive circuit 300 may be operated by receiving power by the bootstrap capacitor C connected between the terminal $V_S$ and the terminal $V_B$ having the same electric potential as an output terminal OUT.

The level shift circuit 400 may provide a signal input from the high-voltage input terminal $H_{in}$ for the high-voltage drive circuit 300. A reference voltage of the high-voltage drive circuit 300 may be a high-voltage or a low-voltage according to a state of a signal output from the output terminal OUT. Even in a case in which a reference voltage of the high-voltage drive circuit 300 is changed, a logic value (0 or 1) input from the high-voltage input terminal $H_{in}$ may be provided for the high-voltage drive circuit 300. The level shift circuit 400 may include a set level shift element for outputting an on signal and a reset level shift element for outputting an off signal, and these level shift elements may include a laterally diffused MOS (LDMOS).

Figure 2:
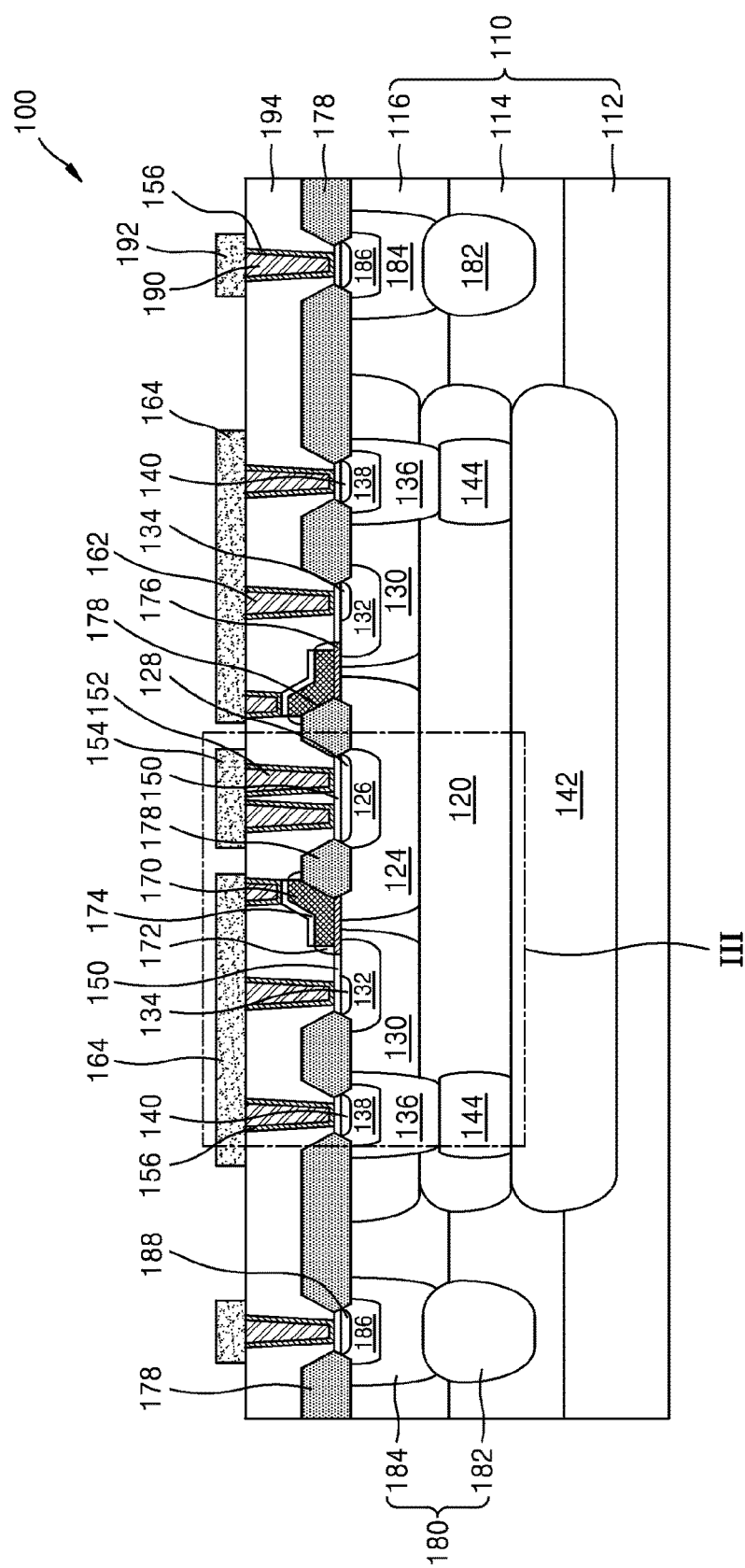
FIG. 2 is a cross-sectional view illustrating a bootstrap diode according to the exemplary embodiments.
Figure 3:
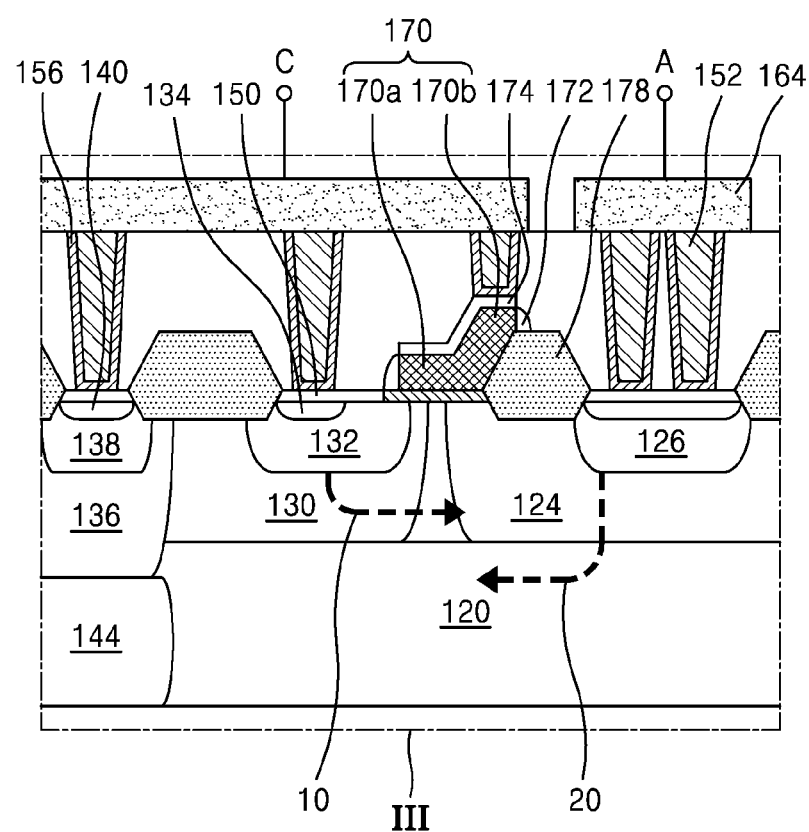
FIG. 3 is an enlarged cross-sectional view of a portion III in FIG. 2.

FIG. 2 is a cross-sectional view illustrating a bootstrap diode 100 according to the exemplary embodiments, and FIG. 3 is an enlarged view of a portion III in FIG. 2.

With reference to FIGS. 2 and 3, a base substrate 112 may include a semiconductor substrate of a group V compound semiconductor substrate such as a silicon substrate, a germanium substrate, a silicon germanium substrate, a silicon carbide substrate, a group III-V compound semiconductor substrate such as a gallium arsenide substrate, and the like. In the base substrate 112, a p-type impurity may be included in a predetermined concentration. For example, the base substrate 112 may have a p-type impurity concentration of about 1E12 to about 1E14 $cm^{-3}$, but the p-type impurity concentration is not limited thereto.

A first semiconductor layer 114 may be disposed at a predetermined thickness on the base substrate 112. The first semiconductor layer 114 may include a group V compound semiconductor such as silicon, germanium, silicon germanium, and silicon carbide, a group III-V compound semiconductor such as gallium arsenide, and the like. The first semiconductor layer 114 may include an n-type epitaxial layer grown by an epitaxial growth process on the base substrate 112.

According to an exemplary embodiment of the present disclosure, the first semiconductor layer 114 may have an n-type impurity concentration of about 1E12 to about 1E17 $cm^{-3}$, but the n-type impurity concentration of the first semiconductor layer 114 is not limited thereto. According to exemplary embodiments of the present disclosure, the first semiconductor layer 114 may include the same material as a material of the base substrate 112 without limitation, and the first semiconductor layer 114 may include a different material from a material of the base substrate 112.

A second semiconductor layer 116 may be disposed at a predetermined thickness on the first semiconductor layer 114. The second semiconductor layer 116 may include a group V compound semiconductor such as silicon, germanium, silicon germanium, and silicon carbide, a group III-V compound semiconductor such as gallium arsenide, and the like. The second semiconductor layer 116 may include the same material as the first semiconductor layer 114, or may include a different material from the first semiconductor layer 114. The second semiconductor layer 116 may include an n-type epitaxial layer grown by an epitaxial growth process.

According to exemplary embodiments of the present disclosure, the second semiconductor layer 116 may have an n-type impurity concentration of about 1E12 to about 1E17 $cm^{-3}$, but the n-type impurity concentration of the second semiconductor layer 116 is not limited thereto. According to exemplary embodiments of the present disclosure, the second semiconductor layer 116 may have an n-type impurity concentration substantially greater than the n-type impurity concentration of the first semiconductor layer 114. However, the n-type impurity concentration of the second semiconductor layer 116 is not limited thereto.

Meanwhile, thicknesses and the n-type impurity concentrations of the first semiconductor layer 114 and the second semiconductor layer 116 may be changed according to a dimension of the bootstrap diode 100, a drive current, a required breakdown voltage, and the like. For example, in a case in which a breakdown voltage required for the bootstrap diode 100 is relatively high, the first semiconductor layer 114 may have a relatively greater thickness, or the first semiconductor layer 114 may have a relatively low n-type impurity concentration.

Here, the base substrate 112, and the first semiconductor layer 114 and the second semiconductor layer 116 which are sequentially disposed on the base substrate 112, are collectively referred to as a substrate 110. For example, the substrate 110 may include a base substrate 112 including single crystal silicon, a first semiconductor layer 114 including an epitaxial silicon layer, and a second semiconductor layer 116 including an epitaxial silicon layer.

An N-type isolation region (NISO region) 120 may be disposed inside the substrate 110, and at least a portion of the NISO region 120 may be disposed inside the first semiconductor layer 114. According to exemplary embodiments of the present disclosure, as illustrated in FIG. 2, a lower portion or a portion of a lower side of the NISO region 120 may be disposed inside the first semiconductor layer 114, and an upper portion of the NISO region 120 may be disposed inside the second semiconductor layer 116. For example, an upper surface of the NISO region 120 may be located on a higher level (e.g., may be shallower in depth within the bootstrap diode 100) than an upper surface of the first semiconductor layer 114. However, alternatively, the entire NISO region 120 may be located inside the first semiconductor layer 114, and the upper surface of the NISO region 120 may be located substantially on the same level (e.g., at the same depth) as the upper surface of the first semiconductor layer 114.

According to exemplary embodiments of the present disclosure, the NISO region 120 may be a region including an n-type impurity at a low concentration. For example, the NISO region 120 may have a first n-type impurity concentration of about 1E12 to 1E17 $cm^{-3}$. According to exemplary embodiments of the present disclosure, the NISO region 120 may have the same n-type impurity concentration as that of the first semiconductor layer 114 and/or the second semiconductor layer 116. For example, in a formation process of the NISO region 120, after the first semiconductor layer 114 and the second semiconductor layer 116 having the first n-type impurity concentration are grown on the base substrate 112, a portion of the first semiconductor layer 114 and the second semiconductor layer 116 may be defined as the NISO region 120. In this case, the NISO region 120 may include the same n-type impurity concentration as the first semiconductor layer 114 and/or the second semiconductor layer 116.

According to other exemplary embodiments of the present disclosure, an NISO region 120 may have a first n-type impurity concentration greater than that of a first semiconductor layer 114 and/or a second semiconductor layer 116. After the first semiconductor layer 114 and the second semiconductor layer 116 are grown to have a second n-type impurity concentration and a third n-type impurity concentration, respectively, the NISO region 120 may be defined by further performing a process of injecting an n-type impurity into a portion of the first semiconductor layer 114 and the second semiconductor layer 116. In this case, the NISO region 120 may have the first n-type impurity concentration greater than the second n-type impurity concentration and greater than the third n-type impurity concentration.

The NISO region 120 may function as an active region in which a hole current 20 is generated by hole movement when a bootstrap diode 100 is in the on state (for example, the bootstrap diode 100 is forward biased or in a forward conductive state). In addition, the NISO region 120 may function as a region blocking a high electric field when the bootstrap diode 100 is in the off state. Thus, a thickness and a first n-type impurity concentration of the NISO region 120 may be changed according to a required breakdown voltage or a required forward current of the bootstrap diode 100.

A high-voltage p-type well 124 may be disposed on the NISO region 120. The high-voltage p-type well 124 may be located inside the second semiconductor layer 116. According to exemplary embodiments of the present disclosure, the entire bottom surface of the high-voltage p-type well 124 may be in contact with (or define an interface with) an upper surface of the NISO region 120, and a bottom surface of the high-voltage p-type well 124 may be located on a higher level (e.g., a shallower depth) than an upper surface of the first semiconductor layer 114. The high-voltage p-type well 124 may be a first p-type impurity region including a p-type impurity at a low concentration. According to exemplary embodiments of the present disclosure, the high-voltage p-type well 124 may have a p-type impurity concentration of about 1E12 to 1E17 $cm^{-3}$, but the p-type impurity concentration of the high-voltage p-type well 124 is not limited thereto.

The p-type well 126 may be disposed on the high-voltage p-type well 124. The p-type well 126 may be formed on the high-voltage p-type well 124 inside the second semiconductor layer 116, and the p-type well 126 may be disposed such that the high-voltage p-type well 124 surrounds a bottom surface and a lateral surface of the p-type well 126. In other words, the p-type well 124 may be disposed within (e.g., entirely disposed within) the p-type well 126. The p-type well 126 may be a second p-type impurity region including a p-type impurity at a high concentration. According to exemplary embodiments of the present disclosure, the p-type well 126 may have an impurity concentration of about 1E16 to 1E20 $cm^{-3}$, but the impurity concentration of the p-type well 126 is not limited thereto. In a case in which the bootstrap diode 100 is in an on state, the p-type well 126 may function as a source region (for example, a hole supply region supplying a hole inside the high-voltage p-type well 124) of a hole current 20 flowing inside the NISO region 120 through the high-voltage p-type well 124.

The p-type impurity regions including the high-voltage p-type well 124 and the p-type well region 126, and the NISO region 120 may configure or may define a p-n junction diode. In a case in which the p-n junction diode is reverse biased, a depletion region may be expanded inside the high-voltage p-type well 124 and the NISO region 120 from an interface between the high-voltage p-type well 124 and the NISO region 120.

A p+ region 128 may be disposed on the p-type well 126. The p+ region 128 may be a contact region formed for a reduction in resistance with a silicide layer 150 formed on the p+ region 128. The p+ region 128 may have a p-type impurity concentration of about 1E18 to 5E21 $cm^{-3}$, but the p-type impurity concentration of the p+ region 128 is not limited thereto. The silicide layer 150 may be disposed on the p+ region 128, and an anode contact plug 152 may be disposed on the silicide layer 150. According to exemplary embodiments of the present disclosure, the silicide layer 150 may include cobalt silicide, tungsten silicide, nickel silicide, tantalum silicide, and the like, but a material of the silicide layer 150 is not limited thereto.

An anode electrode 154 may be disposed to be connected to the anode contact plug 152. Meanwhile, a field oxide layer 178 may be disposed on the second semiconductor layer 116, and an upper insulating layer 194 may be disposed on the field oxide layer 178. An anode contact hole (not shown) may be formed in the upper insulating layer 194, and the anode contact hole may be filled with the anode contact plug 152. Meanwhile, a field oxide layer 178 may not be disposed below the anode contact plug 152.

A diffusion barrier layer 156 may be disposed at a predetermined thickness between the silicide layer 150 and the anode contact plug 152. For example, the diffusion barrier layer 156 may include titanium nitride (TiN), tantalum nitride (TaN), and the like.

A high-voltage n-type well 130 may be disposed on one side of the high-voltage p-type well 124. The high-voltage n-type well 130 may be disposed inside the second semiconductor layer 116, and the NISO region 120 may be disposed below the high-voltage n-type well 130. According to exemplary embodiments of the present disclosure, as illustrated in FIG. 2, in a case in which an upper surface of the NISO region 120 may be located in a higher level (e.g., at a shallower depth) than an upper surface of the first semiconductor layer 114, a bottom surface of the high-voltage n-type well 130 may be located on a higher level (e.g., at a shallower depth) than the upper surface of the first semiconductor layer 114 while being in contact with the upper surface of the NISO region 120. According to another exemplary embodiment of the present disclosure, in a case in which an upper surface of the NISO region 120 is located on the substantially same level (e.g., a same depth) as an upper surface of the first semiconductor layer 114, a bottom surface of the high-voltage n-type well 130 may be located on the substantially same level (e.g., a same depth) as a bottom surface of the second semiconductor layer 116. The high-voltage n-type well 130 may be a first n-type impurity region including an n-type impurity at a low concentration. According to exemplary embodiments of the present disclosure, the high-voltage n-type well 130 may have an n-type impurity concentration of about 1E12 to 1E17 $cm^{-3}$, but the n-type impurity concentration of the high-voltage n-type well 130 is not limited thereto.

An n-type well 132 may be disposed on the high-voltage n-type well 130. The n-type well 132 may be formed on the high-voltage n-type well 130 inside the second semiconductor layer 116, and the n-type well 132 may be disposed such that the high-voltage n-type well 130 surrounds a bottom surface and a lateral surface of the n-type well 132. In other words, the n-type well 132 may be disposed within (e.g., entirely disposed within) the n-type well 130. The n-type well 132 may be a second n-type impurity region including an n-type impurity at a high concentration. According to exemplary embodiments of the present disclosure, the n-type well 132 may have an impurity concentration of about 1E16 to 1E20 $cm^{-3}$, and the impurity concentration of the n-type well 132 is not limited thereto. In a case in which the bootstrap diode 100 is in an on state, the n-type well 132 may function as a source region (for example, an electron supply region supplying an electron inside the high-voltage n-type well 130) of an electron current (or electron flowing) 10 flowing in a direction of the high-voltage p-type well 124 through the high-voltage n-type well 130.

An n+ region 134 may be disposed on the n-type well 132. The n+ region 134 may be a contact region formed for a reduction in resistance with the silicide layer 150 formed on the n+ region 134. The n+ region 134 may have an n-type impurity concentration of about 1E18 to 5E21 $cm^{-3}$, but the n-type impurity concentration of the n+ region 134 is not limited thereto.

The silicide layer 150 may be disposed on the n+ region 134, and a cathode contact plug 162 may be disposed on the silicide layer 150 on the n+ region 134. A cathode contact hole (not shown) passing through the upper insulating layer 194 in an upper portion of the second semiconductor layer 116, may be filled with the cathode contact plug 162. A cathode electrode 164 may be electrically connected to the cathode contact plug 162 on the upper insulating layer 194.

A lateral n-type well 138 may be disposed inside the second semiconductor layer 116 on one side of the n-type well 132. The p-type well 126 and the lateral n-type well 138 may be disposed at a distance away from each other (e.g., may be separated from one another), with at least the n-type well 132 interposed (or disposed) therebetween. The lateral n-type well 138 may be a region including an n-type impurity at a high concentration and, for example, the lateral n-type well 138 may have an n-type impurity concentration of about 1E16 to 1E20 cm$^{-3}$.

An n-type sink 136 may be disposed below the lateral n-type well 138. The n-type sink 136 may be disposed inside the second semiconductor layer 116, and may be a region including an n-type impurity at a high concentration. According to exemplary embodiments of the present disclosure, the n-type sink 136 may have an n-type impurity concentration of about 1E16 to 1E20 cm$^{-3}$.

An n+ region 140 may be disposed on the lateral n-type well 138, and the cathode contact plug 162 may be formed on the n+ region 140. The n+ region 140 may be electrically connected to the cathode electrode 164 through the cathode contact plug 162.

An n-type buried layer 142 may be disposed below the NISO region 120. At least a portion of the n-type buried layer 142 may be disposed inside the base substrate 112, and at least a portion of the n-type buried layer 142 may be disposed inside the first semiconductor layer 114. For example, an upper surface of the n-type buried layer 142 may be located on a higher level than a bottom surface of the first semiconductor layer 114 while being in contact with a bottom surface of the NISO region 120. According to exemplary embodiments of the present disclosure, the n-type buried layer 142 may be disposed below the entire lower portion of the NISO region 120. In other words, the n-type buried layer 142 may extend laterally across (or below) the entirety of the NISO region 120. According to another exemplary embodiment, the n-type buried layer 142 may be disposed to be in contact with at least a portion of a bottom surface of the NISO region 120.

According to exemplary embodiments of the present disclosure, the n-type buried layer 142 may be a region including an n-type impurity at a high concentration. The n-type buried layer 142 may have a second n-type impurity concentration greater than the first n-type impurity concentration of the NISO region 120. For example, the n-type buried layer 142 may have the second n-type impurity concentration of about 1E16 to 1E20 cm$^{-3}$. However, the second n-type impurity concentration of the n-type buried layer 142 is not limited thereto.

As the n-type buried layer 142 is formed below the NISO region 120, in particular, below the entire bottom surface of the NISO region 120, the NISO region 120 and a portion of the base substrate 112 including a p-type impurity may not be in direct contact with each other. That is because the n-type buried layer 142 including an n-type impurity at a high concentration, is disposed in a portion of the base substrate 112 below the NISO region 120. In a case in which the n-type buried layer 142 is not formed, when the bootstrap diode 100 is in an on state, the high-voltage p-type well 124, the NISO region 120, and the base substrate 112 may include a p-type impurity, an n-type impurity, and a p-type impurity at a low concentration, respectively, thereby configuring or defining a PNP parasitic transistor. In this case, the high-voltage p-type well 124, the NISO region 120, and the base substrate 112 may serve as an emitter region, a base region, and a collector region of the PNP parasitic transistor, respectively, and a parasitic hole current may flow in a direction toward the base substrate 112 through the NISO region 120 from the high-voltage p-type well 124. Thus, the n-type buried layer 142 is disposed between the NISO region 120 and the base substrate 112 including a p-type impurity, and may function as a barrier preventing the PNP parasitic transistor from being formed.

An n-type barrier layer 144 may be disposed below the n-type sink 136. At least a portion of the n-type barrier layer 144 may be located inside the first semiconductor layer 114, and the n-type buried layer 142 may be disposed below the n-type barrier layer 144. According to exemplary embodiments of the present disclosure, an upper surface of the n-type barrier layer 144 may be in contact with a bottom surface of the n-type sink 136, and a bottom surface of the n-type barrier layer 144 may be in contact with an upper surface of the n-type buried layer 142. According to exemplary embodiments of the present disclosure, as illustrated in FIG. 2, the upper surface of the n-type barrier layer 144 may be located on the same (e.g., substantially same) level or depth as an upper surface of the first semiconductor layer 114. Alternatively, as at least a portion of the n-type barrier layer 144 may be located inside a second semiconductor layer 116, the upper surface of the n-type barrier layer 144 may be located on a higher level than the upper surface of the first semiconductor layer 114.

The n-type barrier layer 144 may be an n-type impurity region including an n-type impurity at a high concentration. The n-type barrier layer 144 may have, for example, a third n-type impurity concentration of about 1E16 to 1E20 cm$^{-3}$, and the third n-type impurity concentration may be greater than a first n-type impurity concentration of the NISO region 120.

The n-type barrier layer 144 together with the n-type sink 136 may be disposed to laterally confine the NISO region 120 (for example, the n-type barrier layer 144 may be disposed on one side of the NISO region 120 in a direction in parallel with an upper surface of the base substrate 112). Thus, the n-type barrier layer 144 may serve as a barrier preventing a hole current 20 (which flows to the NISO region 120 through the high-voltage p-type well 124 from the p-type well 126) from leaking laterally.

The gate electrode 170 may be disposed between the anode contact plug 152 and the cathode contact plug 162 on the second semiconductor layer 116. The field oxide layer 178 may be interposed in (e.g., disposed in) at least a portion between the gate electrode 170 and the second semiconductor layer 116, whereby the gate electrode 170 may be disposed across an edge portion of the field oxide layer 178. For example, the gate electrode 170 may include a first portion 170a and a second portion 170b, the field oxide layer 178 may not be disposed below the first portion 170a of the gate electrode 170, and the field oxide layer 178 may be disposed below the second portion 170b of the gate electrode 170. The gate electrode 170 may be disposed to be conformal according to a shape of the field oxide layer 178, and according to the edge portion of the field oxide layer 178. According to exemplary embodiments of the present disclosure, the gate electrode 170 may include polysilicon doped with an impurity, but a material of the gate electrode 170 is not limited thereto.

A gate spacer 172 including an insulation material may be disposed on a sidewall of the gate electrode 170. A gate silicide layer 174 may be formed at a predetermined thickness on the gate electrode 170. A gate insulating layer 176 may be interposed (e.g., disposed) between the first portion 170a of the gate electrode 170 and the second semiconductor layer 116. Accordingly, the gate insulating layer 176 disposed below the first portion 170a of the gate electrode 170, may be connected to a portion of the field oxide layer 178 disposed below the second portion 170b of the gate electrode 170.

An element isolation region 180 may be disposed on one side of the NISO region 120. The element isolation region 180 may include a lower element isolation layer 182 and an upper element isolation layer 184 disposed on the lower element isolation layer 182. The element isolation region 180 may be an impurity region doped with a p-type impurity at a low concentration, and may function to electrically isolate a bootstrap diode 100 from low-voltage circuits disposed to be adjacent thereto (not shown), high-voltage circuits (not shown), or level shift circuits (not shown). The element isolation region 180 may have, for example, a p-type impurity concentration of about 1E12 to 1E15 cm$^{-3}$, but the p-type impurity concentration of the element isolation region 180 is not limited thereto.

At least a portion of the lower element isolation layer 182 may be located inside the first semiconductor layer 114. According to exemplary embodiments of the present disclosure, as illustrated in FIG. 2, a bottom surface of the lower element isolation layer 182 may be located on a higher level than an upper surface of the base substrate 112. However, alternatively, in order to locate a bottom surface of the lower element isolation layer 182 on a lower level than an upper surface of the base substrate 112, the lower element isolation layer 182 may be further extended toward the base substrate 112 downwards.

The upper element isolation layer 184 may be disposed inside the second semiconductor layer 116 on the lower element isolation layer 182. As illustrated in FIG. 2, a bottom surface of the lower element isolation layer 182 may be in contact with an upper surface of the upper element isolation layer 184.

A ground region 186 may be disposed on the element isolation region 180, and a p+ region 188 may be disposed on the ground region 186. A ground contact plug 190 may be disposed on the p+ region 188, and a ground electrode 192 may be disposed to be connected to the ground contact plug 190 on the upper insulating layer 194.

In the bootstrap diode 100, a concentration of an impurity included in an epitaxial layer disposed on a semiconductor substrate may be closely related to a breakdown voltage of the bootstrap diode 100. For example, in a case in which an impurity concentration of the epitaxial layer is low, a higher voltage may be blocked, thereby increasing a breakdown voltage of the bootstrap diode 100. On the other hand, in a case in which the impurity concentration of the epitaxial layer is low, a considerable amount of a leakage current may flow to the semiconductor substrate due to formation of the parasitic PNP transistor. In other words, a trade-off relationship between a high breakdown voltage and a low substrate leakage current of the bootstrap diode 100 may be provided. However, in order to use the bootstrap diode 100, the high breakdown voltage and the substrate leakage current are required at the same time, whereby the bootstrap diode 100 may not be used alone. For example, in order to prevent the leakage current, a chip including a low-voltage circuit and a chip including a high-voltage circuit are manufactured individually, and the chips are disposed inside one package, or a MOSFET corresponding to a separate charge pump circuit is additionally formed, thereby using a synchronous rectifier. However, in a case using these configurations, the whole size of a power semiconductor device module may become larger and manufacturing costs thereof may be increased in an undesirable fashion.

However, in the bootstrap diode 100 according to the technical concept of the present disclosure, the n-type buried layer 142 is disposed below the NISO region 120, thereby preventing the NISO region 120 and a portion of the base substrate 112 including a p-type impurity from being in contact with each other. Thus, the parasitic hole current due to the PNP parasitic transistor may be prevented from flowing toward a portion of the base substrate 112 through the NISO region 120 from the high-voltage p-type well 124.

Meanwhile, as a second n-type impurity concentration of the n-type buried layer 142 is relatively high (for example, as a second n-type impurity concentration of the n-type buried layer 142 is higher than a first n-type impurity concentration of the NISO region 120), a breakdown voltage of the bootstrap diode 100 may be decreased. However, as the first semiconductor layer 114 and the second semiconductor layer 116 may be sequentially disposed on the base substrate 112, an epitaxial layer (for example, first and second semiconductor layers 114 and 116) formed on the base substrate 112 may have a relatively greater thickness. In a case in which a thickness of the epitaxial layer (for example, first and second semiconductor layers 114 and 116) is great, a reduction in a breakdown voltage by the n-type buried layer 142 may be compensated, thereby resulting in the bootstrap diode 100 having a high breakdown voltage.

Thus, the bootstrap diode 100 may have a significantly low substrate leakage current and may have a high breakdown voltage at the same time. In a case in which the bootstrap diode 100 is used, a high-voltage circuit and a low-voltage circuit of a high-voltage integrated circuit may be integrated in a monolithic fashion inside one substrate, or the additional formation of a separate charge pump circuit and the like may not be required. Thus, a compact power semiconductor device module may be implemented, thereby reducing manufacturing costs.

Figure 4:
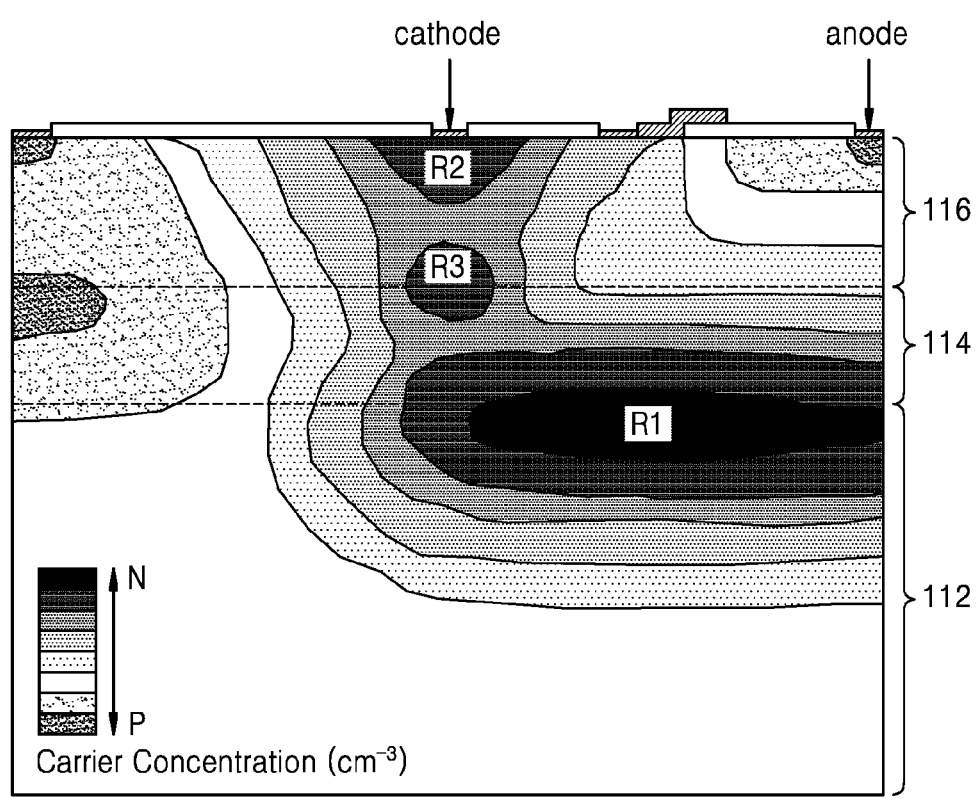
FIG. 4 is a simulation graph illustrating a carrier concentration distribution of a bootstrap diode according to the exemplary embodiments.

FIG. 4 is a simulation graph illustrating a carrier concentration distribution of a bootstrap diode 100 according to the exemplary embodiments. Respective regions indicated as a contour line in FIG. 4 have n-type or p-type carrier concentrations corresponding to a predetermined range, and the regions have higher n-type carrier concentrations or p-type carrier concentrations in a direction of an arrow in a label of FIG. 4 (for example, a region indicated as dark gray means a high-concentration portion, and a region indicated as white or light dots means a low-concentration portion).

With reference to FIG. 4, it is confirmed that a first region R1 having a high n-type carrier concentration is shown in a direction in parallel with an upper surface of a base substrate 112 in an upper portion of the base substrate 112. The first region R1 may correspond to a location of an n-type buried layer (see 142 of FIG. 2) disposed in the upper portion of the base substrate 112. It is confirmed that a second region R2 having a high n-type carrier concentration appears in an upper portion of a second semiconductor layer 116 adjacent to a cathode electrode (cathode), and a third region R3 having a high n-type carrier concentration appears in an edge portion of the first and second semiconductor layers 114 and 116. The second region R2 and the third region R3 may respectively correspond to locations of an n-type sink (see 136 of FIG. 2) and an n-type barrier layer (see 144 of FIG. 2) individually.

The first region R1, the second region R2, and the third region R3 may surround an NISO region (see 120 of FIG. 2)

located between a portion of the first semiconductor layer 114 below the cathode electrode (cathode), and a portion of the first semiconductor layer 114 below the anode electrode (anode). The first to third regions R1, R2, and R3 may prevent a leakage current from flowing from the NISO region 120 laterally or downwards.

Figure 5:
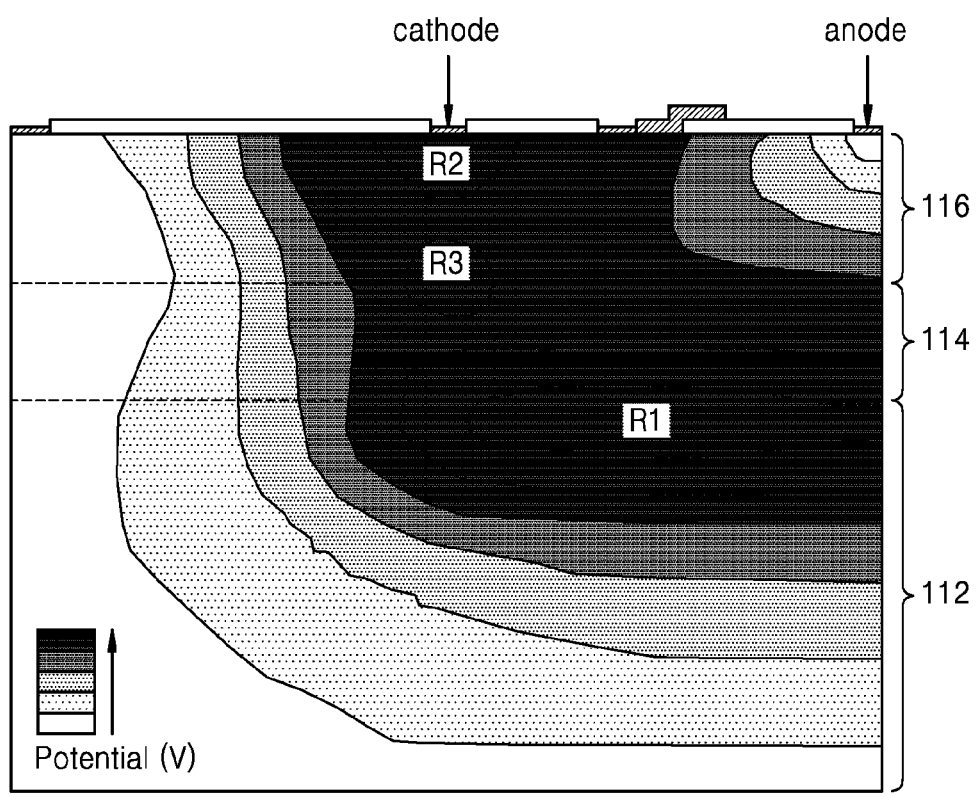
FIG. 5 is a simulation graph illustrating a potential distribution in an OFF state of a bootstrap diode according to the exemplary embodiments.

FIG. 5 is a simulation graph illustrating a potential distribution in an off state of a bootstrap diode 100 according to the exemplary embodiments. Respective regions indicated as a contour line in FIG. 5 may have electric potentials corresponding to a predetermined range, and the regions have higher potential in a direction of an arrow in a label of FIG. 5 (for example, a region indicated as dark gray means a high potential region, and a region indicated as white or light dots means a low potential region). Meanwhile, for the explicit comparison, the first region R1, the second region R2, and the third region R3 having a high n-type carrier concentration in FIG. 4 are indicated as dotted lines in FIG. 5.

With reference to FIG. 5, in a case in which a bootstrap diode 100 is in an off state, the bootstrap diode 100 may be reverse biased from a cathode electrode (cathode) to anode electrode (anode). A high potential may be confirmed to be sustained in a relatively large area in a portion of the first semiconductor layer 114 and a portion of the second semiconductor layer 116 from the cathode electrode (cathode) to the anode electrode (anode). In other words, in a case in which the bootstrap diode 100 is in an off state, when a potential of the cathode electrode (cathode) becomes high, a depletion region is expanded from the first semiconductor layer 114 to the base substrate 112, thereby blocking a high-voltage. Particularly, the relatively thick first and second semiconductor layers 114 and 116 may be inferred to be able to compensate a reduction in a breakdown voltage by the n-type buried layer (142 of FIG. 2).

Figure 6:
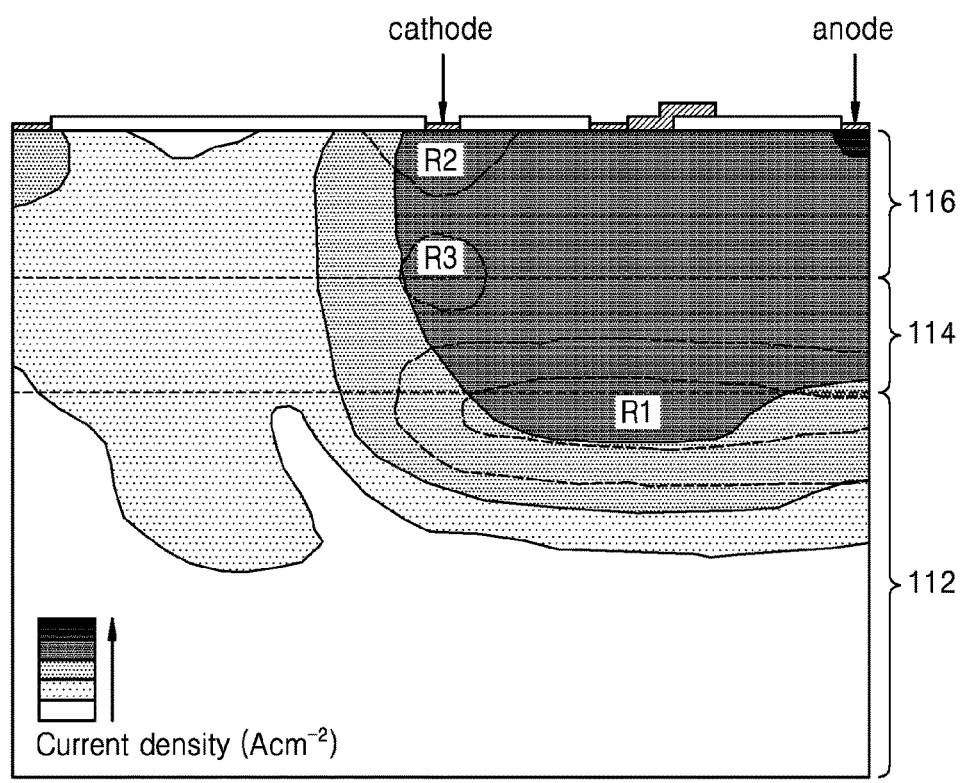
FIG. 6 is a simulation graph illustrating a current density distribution in an ON state of a bootstrap diode according to the exemplary embodiments.

FIG. 6 is a simulation graph illustrating a current density distribution in an on state of a bootstrap diode 100 according to the exemplary embodiments. In FIG. 6, respective regions indicated as a contour line may have current densities corresponding to a predetermined range, and the region have a higher current density in a direction of an arrow in a legend of FIG. 6 (For example, a region indicated as dark gray means a high current density region, and a region indicated as white or light dots means a low current density region). Meanwhile, for the explicit comparison, a first region R1, a second region R2, and a third region R3 having a high n-type carrier concentration in FIG. 4 are indicated as dotted lines in FIG. 6.

With reference to FIG. 6, when the bootstrap diode 100 is in an on state, a forward current may flow from a cathode electrode (cathode) to an anode electrode (anode) (in other words, it may be forward biased). A portion of a first semiconductor layer 114 and a portion of a second semiconductor layer 116 from a cathode electrode (cathode) to an anode electrode (anode) may be confirmed to have a high current density over a relatively large area. Particularly, a boundary of regions having a high current density corresponds to a location of portions of the first region R1, the second region R2, and the third region R3.

In addition, a significantly low current density is indicated in a lower portion of a base substrate 112. It is more explicitly confirmed through a comparison with a comparative example having a single semiconductor layer, and not having an n-type buried layer (reference to 142 of FIG. 2) and an n-type barrier layer (reference to 144 of FIG. 2). In the following table 1, an anode current, a substrate leakage current, and a substrate leakage ratio (in other words, a ratio of a substrate leakage current by an anode current) of bootstrap diodes according to a comparative example and an example are compared and indicated.

TABLE 1

| | Anode current(Acm$^{-2}$) | Substrate leakage current(Acm$^{-2}$) | Substrate leakage ratio(%) |
|---|---|---|---|
| Comparative example | 2.75E$^{-5}$ | 2.01E$^{-5}$ | 73.1 |
| Example | 1.73E$^{-5}$ | 2.03E$^{-7}$ | 1.2 |

With reference to Table 1, Comparative example has an anode current of about 1.6 times of Example (for example, a current density measured in an anode electrode), but Comparative example has a substrate leakage current (in other words, a current density base measured in a bottom surface of a substrate) close to about 100 times of Example. In a case of Comparative example, a ratio of a substrate leakage current with respect to an anode current may amount to about 73.1%, and a considerable amount of current flows toward a substrate lower portion. Without a separate component (for example, a MOSFET device) for preventing a substrate leakage current, it is difficult to be used as a bootstrap diode.

Otherwise, in a case of Example, a ratio of a substrate leakage current with respect to an anode current is about 1.2%. Portions of the n-type buried layer 142, the n-type sink 136, and the n-type barrier layer 144 (for example, portions corresponding to portions of a first region R1, a second region R2, and a third region R3 in FIG. 6) may prevent holes from flowing toward a lower portion of a substrate or laterally, thereby significantly reducing a substrate leakage current. Thus, even without a separate component (for example, a MOSFET device) for preventing a substrate leakage current, it may be used as a bootstrap diode, thereby providing a power semiconductor device module which is compact and whose manufacturing costs are reduced.

Figure 7:
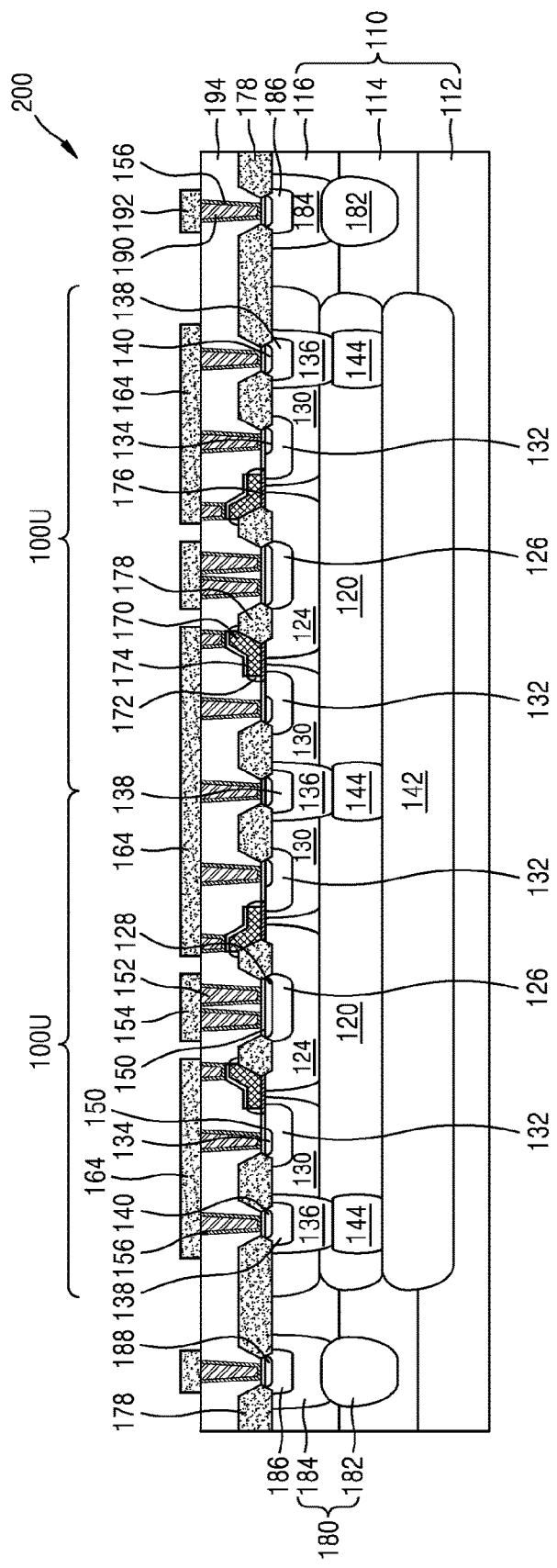
FIG. 7 is a cross-sectional view illustrating a bootstrap diode according to the exemplary embodiments.

FIG. 7 is a cross-sectional view illustrating a bootstrap diode 200 according to exemplary embodiments. The bootstrap diode 200 is similar to the bootstrap diode 100 illustrated in FIG. 2, except for including a plurality of unit cells.

With reference to FIG. 7, a plurality of unit cells 100U may be disposed on a cell region (not shown) of a substrate 110 defined by an element isolation region 180. Each of the plurality of unit cells 100U may have the technical features similar to the bootstrap diode 100 described in more detail in connection with FIGS. 2 and 3.

Each of the plurality of unit cells 100U may include an anode electrode 154, and a cathode electrode 164 disposed at a distance away from the anode electrode 154 on both sides of the anode electrode 154. A cathode electrode 164 inside one unit cell 100U among the plurality of unit cells 100U may be disposed to be connected to a cathode electrode 164 inside a unit cell 100U adjacent thereto among the plurality of unit cells 100U. However, the technical idea of the present implementations is not limited thereto.

As illustrated in FIG. 7, an n-type buried layer 142 is configured to overlap with the total area of the plurality of unit cells 100U included in (e.g., inside) a substrate 110, and a plurality of NISO regions 120 may be disposed on the n-type buried layer 142. A plurality of n-type barrier layers 144 may be disposed in respective lateral surfaces of the plurality of NISO regions 120.

In FIG. 7, a bootstrap diode 200 including two unit cells 100U is illustrated as an example, but the technical idea of the present implementation is not limited thereto. The number of the plurality of unit cells 100U may be changed according to a current capacity of the bootstrap diode 200.

According to the bootstrap diode 200, each of the plurality of unit cells 100 may be correspond to each of the plurality of diodes connected in parallel, thereby allowing the bootstrap diode 200 to have a large current capacity. In addition, a leakage current by the n-type buried layer 142, flowing to a portion of a base substrate 112 through the NISO region 120 from a high-voltage p-type well 124 may be greatly reduced, and the bootstrap diode 200 may have a high breakdown voltage.

FIGS. 8 to 16 are cross-sectional views illustrating a fabrication method of a bootstrap diode 100 according to the exemplary embodiments.

Figure 8:
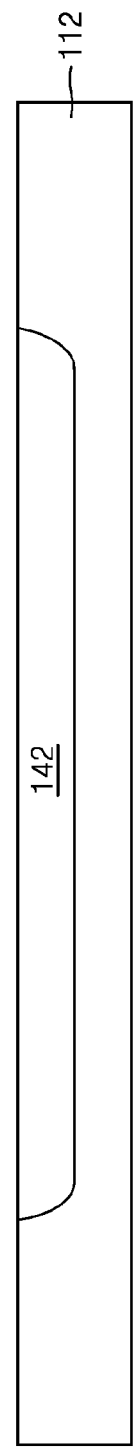
FIGS. 8 to 16 are cross-sectional views illustrating a fabrication method of a bootstrap diode according to the exemplary embodiments.

With reference to FIG. 8, a first ion implantation process is performed on a base substrate 112 to inject n-type impurity ions, thereby forming an n-type buried layer 142.

The base substrate 112 may include a semiconductor substrate of a group V compound semiconductor substrate such as a silicon substrate, germanium substrate, a silicon germanium substrate, and a silicon carbide substrate, a group III-V compound semiconductor substrate such as a gallium arsenide substrate, and the like. A p-type impurity may be included at a predetermined concentration in the base substrate 112.

A first photoresist pattern (not shown) is formed on the base substrate 112, and n-type impurity ions are injected by using the first photoresist pattern as an ion implantation mask, thereby forming the n-type buried layer 142 in a portion in an upper side of the base substrate 112. In this case, the ion implantation energy of the first ion implantation process may be about 50 keV to about 200 keV, but the ion implantation energy of the first ion implantation process is not limited thereto. The n-type buried layer 142 may include an n-type impurity of about 1E16 to 1E20 $cm^{-3}$.

After the first ion implantation process, a heat treatment process may be selectively performed for drive-in of impurity ions injected in the above process.

Figure 9:
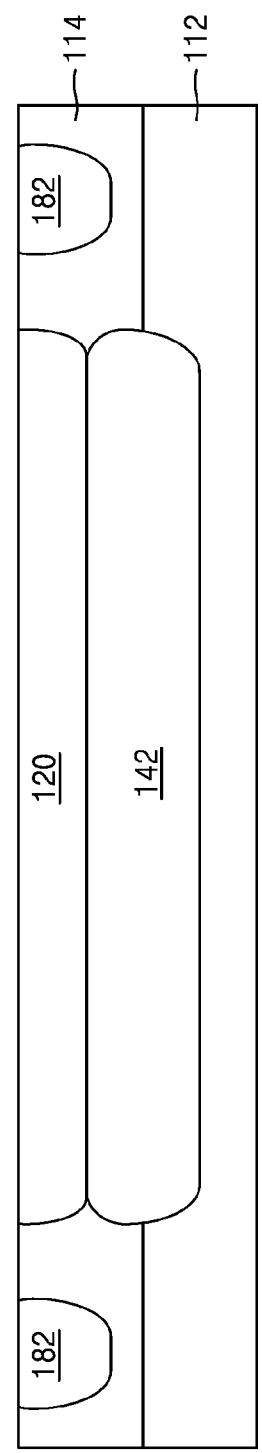

With reference to FIG. 9, a selective epitaxial growth process is performed on a base substrate 112, thereby forming a first semiconductor layer 114 at a first thickness (TH1). The first semiconductor layer 114 may have a first thickness (TH1) of about 1 to 10 micrometers, but the first thickness (TH1) of the first semiconductor layer 114 is not limited thereto. In a growth process of the first semiconductor layer 114, the first semiconductor layer 114 may be in-situ doped with n-type impurity ions, whereby the first semiconductor layer 114 may have an impurity concentration of about 1E12 to 1E17 $cm^{-3}$. For example, the first semiconductor layer 114 may have specific resistance of about 1 to 30 Ωcm, which is a value for exemplarily illustrating, and the specific resistance of the first semiconductor layer 114 is not limited thereto.

After the second photoresist pattern (not shown) is formed on the first semiconductor layer 114, a second ion implantation process is performed by using the second photoresist pattern as an ion implantation mask to inject p-type impurity ions inside the first semiconductor layer 114, thereby forming a lower element isolation layer 182. According to exemplary embodiments of the present disclosure, the lower element isolation layer 182 may have an impurity concentration of about 1E12 to 1E15 $cm^{-3}$, but the impurity concentration of the lower element isolation layer 182 is not limited thereto.

After the second ion implantation process, a heat treatment process for drive-in of the injected impurity ions may be selectively performed.

Thereafter, after a third photoresist pattern (not shown) is formed on the first semiconductor layer 114, a third ion implantation process is performing by using the third photoresist pattern as an ion implantation mask to inject n-type impurity ions inside the first semiconductor layer 114, thereby forming an NISO region 120. The NISO region 120 may have an n-type impurity concentration of about 1E12 to 1E17 $cm^{-3}$, but an impurity concentration of the NISO region 120 is not limited thereto. According to exemplary embodiments of the present disclosure, the NISO region may be disposed at a distance away from the lower element isolation layer 182.

After the third ion implantation process, a heat treatment process for drive-in of the injected impurity ions may be selectively performed. In addition, a heat treatment process is not performed after the second ion implantation process, but the heat treatment process may be performed after the third ion implantation process. In this case, impurity ions injected into the lower element isolation layer 182 and impurity ions injected into the NISO region 120 by the heat treatment process may be driven-in at the same time.

Meanwhile, in the process of forming the first semiconductor layer 114, or in the heat treatment process after the second ion implantation process, or in the heat treatment process after the third ion implantation process, n-type impurity ions injected inside the n-type buried layer 142 are diffused, whereby an upper portion of the n-type buried layer 142 may be extended to an inside of the first semiconductor layer 114. Accordingly, an upper surface of the n-type buried layer 142 may be in contact with a bottom surface of the NISO region 120, and the upper surface of the n-type buried layer 142 may be located on a higher level than an upper surface of the base substrate 112.

Figure 10:
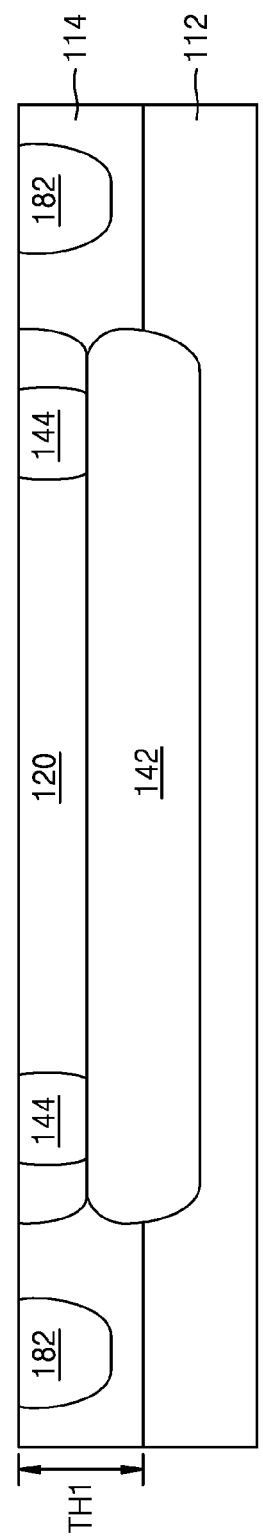

With reference to FIG. 10, after a fourth photoresist pattern (not shown) is formed on a first semiconductor layer 114, a fourth ion implantation process is performed by using the fourth photoresist pattern as an ion implantation mask to inject n-type impurity ions inside the first semiconductor layer 114, thereby forming an n-type barrier layer 144 on one side of the NISO region 120 (or on an edge portion of the NISO region 120). According to exemplary embodiments of the present disclosure, the n-type barrier layer 144 may have an impurity concentration of about 1E16 to 1E20 $cm^{-3}$, but the impurity concentration of the n-type barrier layer 144 is not limited thereto.

After the fourth ion implantation process, a heat treatment process for drive-in of the injected impurity ions may be selectively performed.

A bottom surface of the NISO region 120 is in contact with an upper surface of an n-type buried layer 142, and the n-type barrier layer 144 is formed in a lateral direction of the NISO region 120, whereby the NISO region 120 may be defined (or confined) by an upper surface of the n-type buried layer 142 and a sidewall of the n-type barrier layer 144.

Figure 11:
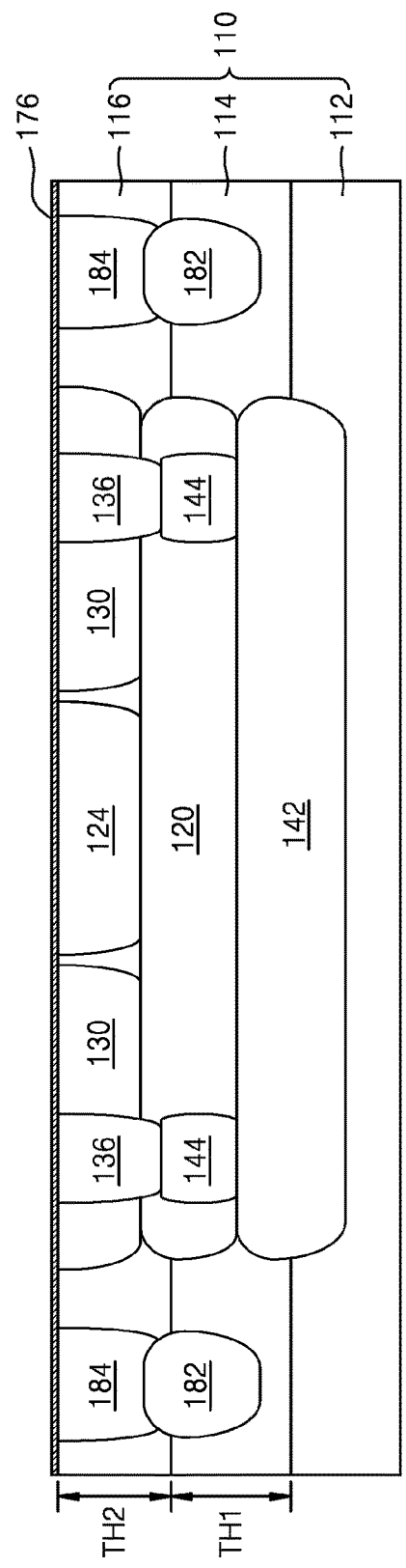

With reference to FIG. 11, a second semiconductor layer 116 may be formed at a second thickness TH2 by a selective epitaxial growth process on a first semiconductor layer 114. The second semiconductor layer 116 may have a second thickness TH2 of about 1 to 10 micrometers, but the second thickness TH2 of the second semiconductor layer 116 is not limited thereto. In a growth process of the second semiconductor layer 116, the second semiconductor layer 116 may be in-situ doped with n-type impurity ions, whereby the second semiconductor layer 116 may have an impurity concentration of about 1E12 to 1E17 cm$^{-3}$. For example, the second semiconductor layer 116 may have specific resistance of about 1 to 30 Ωcm, which is a value for exemplarily illustrating, and the specific resistance of the second semiconductor layer 116 is not limited thereto.

A structure in which a first semiconductor layer 114 having a first thickness TH1 and a second semiconductor layer 116 having a second thickness TH2 are sequentially stacked, may be formed on a base substrate 112. Thus, in comparison with a case of forming a semiconductor layer using a single process of epitaxial growth, semiconductor layers 114 and 116 having an excellent crystal quality and a relatively large thickness may be obtained.

In general, after a semiconductor layer is formed by using an epitaxial growth process, a process of defining active regions of a bootstrap diode such as a NISO region, a p-type well, an n-type well, and the like by injecting impurity ions inside the semiconductor layer, is used. In this case, as a thickness of the semiconductor layer is increased, ion implantation energy used in the process of injecting impurity ions may be increased. After the impurity ions are injected, the semiconductor layer may be damaged, thereby degrading a crystal quality of the semiconductor layer. Thus, specific resistance of the semiconductor layer is increased, and then on-resistance (for example, a resistance value in an on state) of the bootstrap diode is increased, whereby the current characteristic of the bootstrap diode may not be desirable.

In addition, as described above, since the semiconductor layer may not be allowed to grow for a sufficient thickness, in order to obtain a required breakdown voltage, an n region (for example, a NISO region) of a p-n junction diode is required to have a low n-type impurity concentration. However, in a case in which an n-type impurity concentration of the n region is low, a hole current is leaked through a substrate due to a parasitic PNP transistor (for example, the p-type well, the NISO region, and the p-type substrate may configure the parasitic PNP transistor) formed inside the semiconductor layer, as a problem.

However, according to the exemplary embodiments as described in FIGS. 10 and 11, the first semiconductor layer 114 and the second semiconductor layer 116 are sequentially formed, thereby forming semiconductor layers 114 and 116 having a high crystal quality and having a relatively great thickness at the same time.

Hereafter, after a fifth photoresist pattern (not shown) is formed on the second semiconductor layer 116, a fifth ion implantation process is performed by using the fifth photoresist pattern as an ion implantation mask to inject n-type impurity ions inside the second semiconductor layer 116, thereby forming a high-voltage n-type well 130. According to exemplary embodiments of the present disclosure, a high-voltage n-type well 130 may have an impurity concentration of about 1E12 to 1E17 cm$^{-3}$, but the impurity concentration of the high-voltage n-type well 130 is not limited thereto.

After the fifth ion implantation process, a heat treatment process for drive-in of the injected impurity ions may be selectively performed.

Thereafter, after a sixth photoresist pattern (not shown) is formed on the second semiconductor layer 116, a sixth ion implantation process is performed by using the sixth photoresist pattern as an ion implantation mask to inject p-type impurity ions inside the second semiconductor layer 116, thereby forming an upper element isolation layer 184. According to exemplary embodiments of the present disclosure, the upper element isolation layer 184 may have an impurity concentration of about 1E12 to 1E15 cm$^{-3}$, but the impurity concentration of the upper element isolation layer 184 is not limited thereto.

After the sixth ion implantation process, a heat treatment process for drive-in of the injected impurity ions may be selectively performed.

Thereafter, after a seventh photoresist pattern (not shown) is formed on the second semiconductor layer 116, a seventh ion implantation process is performed by using the seventh photoresist pattern as an ion implantation mask to inject p-type impurity ions inside the second semiconductor layer 116, thereby forming a high-voltage p-type well 124. According to exemplary embodiments of the present disclosure, the high-voltage p-type well 124 may have an impurity concentration of about 1E12 to 1E17 cm$^{-3}$, but the impurity concentration of the high-voltage p-type well 124 is not limited thereto.

After the seventh ion implantation process, a heat treatment process for drive-in of the injected impurity ions may be selectively performed.

Thereafter, after an eighth photoresist pattern (not shown) is formed on the second semiconductor layer 116, an eighth ion implantation process is performed by using the eighth photoresist pattern as an ion implantation mask to inject n-type impurity ions inside the second semiconductor layer 116, thereby forming an n-type sink 136. According to exemplary embodiments of the present disclosure, the n-type sink 136 may have an impurity concentration of about 1E16 to 1E20 cm$^{-3}$, but the impurity concentration of the n-type sink 136 is not limited thereto.

After the eighth ion implantation process, a heat treatment process for drive-in of the injected impurity ions may be selectively performed.

Through the fifth to eighth ion implantation processes, a high-voltage n-type well 130, an upper element isolation layer 184, a high-voltage p-type well 124, and an n-type sink 136 may be formed inside the second semiconductor layer 116. However, an order of ion implantation processes for formation of the high-voltage n-type well 130, the upper element isolation layer 184, the high-voltage p-type well 124, and the n-type sink 136 may be changed. In addition, each of the fifth to eighth ion implantation processes is performed, followed by performing four heat treatment processes, respectively. However, the fifth to eighth ion implantation processes are sequentially performed, followed by performing one heat treatment process. Thus, impurity ions injected inside the high-voltage n-type well 130, the upper element isolation layer 184, the high-voltage p-type well 124, and the n-type sink 136 may be driven-in at the same time.

Thereafter, a gate insulating layer 176 may be formed at a predetermined thickness on the second semiconductor layer 116. However, alternatively, after the gate insulating layer 176 is formed on the second semiconductor layer 116 in advance, the fifth to eighth ion implantation processes may be performed.

As described in FIGS. 10 and 11, in a case in which the first semiconductor layer 114 and the second semiconductor layer 116 are sequentially formed, the first semiconductor layer 114 and the second semiconductor layer 116 may be formed to allow the kind or a concentration of an impurity included therein to be the same as each other or to be different from each other. Accordingly, at least one process among the ion implantation processes may be omitted. For example, in a case in which a first semiconductor layer 114 is grown to have an impurity concentration included inside an NISO region 120, a third ion implantation process for formation of the NISO region 120 may be omitted. Alternatively, in a case in which a second semiconductor layer 116 is grown to have an impurity concentration included inside a high-voltage n-type well 130, a fifth ion implantation process for formation of the high-voltage n-type well 130 may be omitted.

Figure 12:
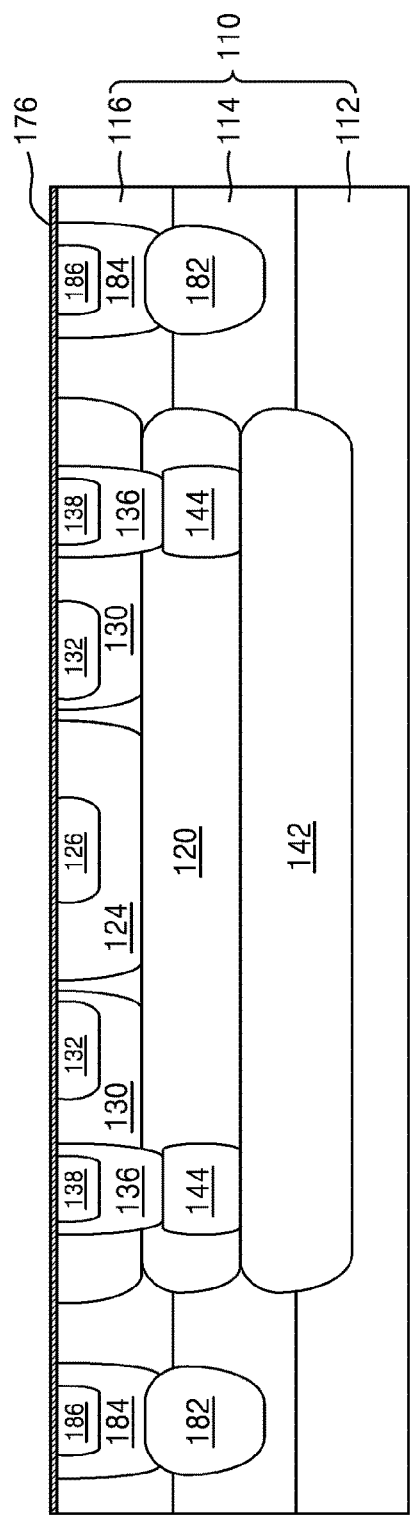

With reference to FIG. 12, after a ninth photoresist pattern (not shown) is formed on a second semiconductor layer 116, a ninth ion implantation process is performed by using the ninth photoresist patterns as an ion implantation mask to inject p-type impurity ions inside the second semiconductor layer 116, thereby forming a p-type well 126 and a ground region 186. According to exemplary embodiments of the present disclosure, the p-type well 126 and the ground region 186 may have an impurity concentration of about 1E16 to 1E20 $cm^{-3}$, but the impurity concentration of the p-type well 126 and the ground region 186 is not limited thereto.

After the ninth ion implantation process, a heat treatment process for drive-in of the injected impurity ions may be selectively performed.

Thereafter, after a tenth photoresist pattern (not shown) is formed on the second semiconductor layer 116, a tenth ion implantation process is performed by using the tenth photoresist pattern as an ion implantation mask to inject n-type impurity ions inside the second semiconductor layer 116, thereby forming an n-type well 132 and a lateral n-type well 138. According to exemplary embodiments of the present disclosure, the n-type well 132 and the lateral n-type well 138 may have an impurity concentration of about 1E16 to 1E20 $cm^{-3}$, but the impurity concentration of the n-type well 132 and the lateral n-type well 138 is not limited thereto.

After the tenth ion implantation process, a heat treatment process for drive-in of the injected impurity ions may be selectively performed.

Figure 13:
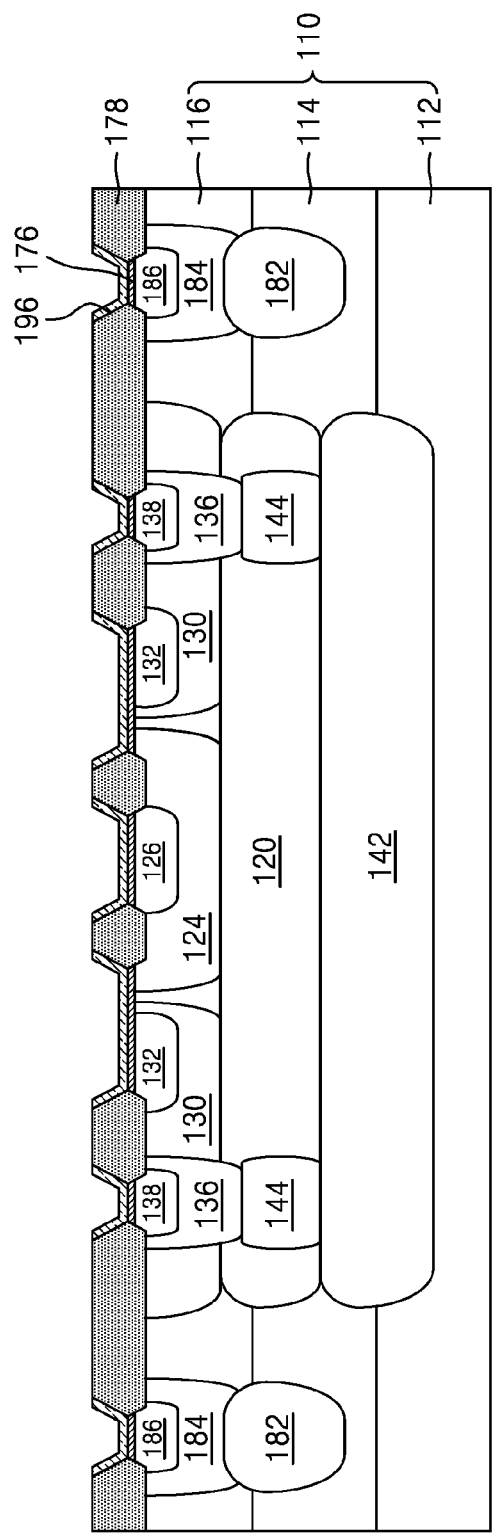

With reference to FIG. 13, a hardmask layer 196 is formed on a gate insulating layer 176, and the hardmask layer 196 is patterned, thereby exposing portions of a lower insulating layer 184 of a portion in which a field region is to be defined. Hereafter, a local oxidation of semiconductor (LOCOS) process is performed, thereby forming a field oxide layer 178 in the exposed portion of the lower insulating layer 184. The field oxide layer 178 may be formed on portions of the second semiconductor layer 116 except for portions in which a contact holes (not shown) is to be formed in a following process. A thickness of the field oxide layer 178 may be about 400 nanometers to 2 micrometers, but the thickness of the field oxide layer 178 is not limited thereto.

Thereafter, the hardmask layer 196 may be removed.

Figure 14:
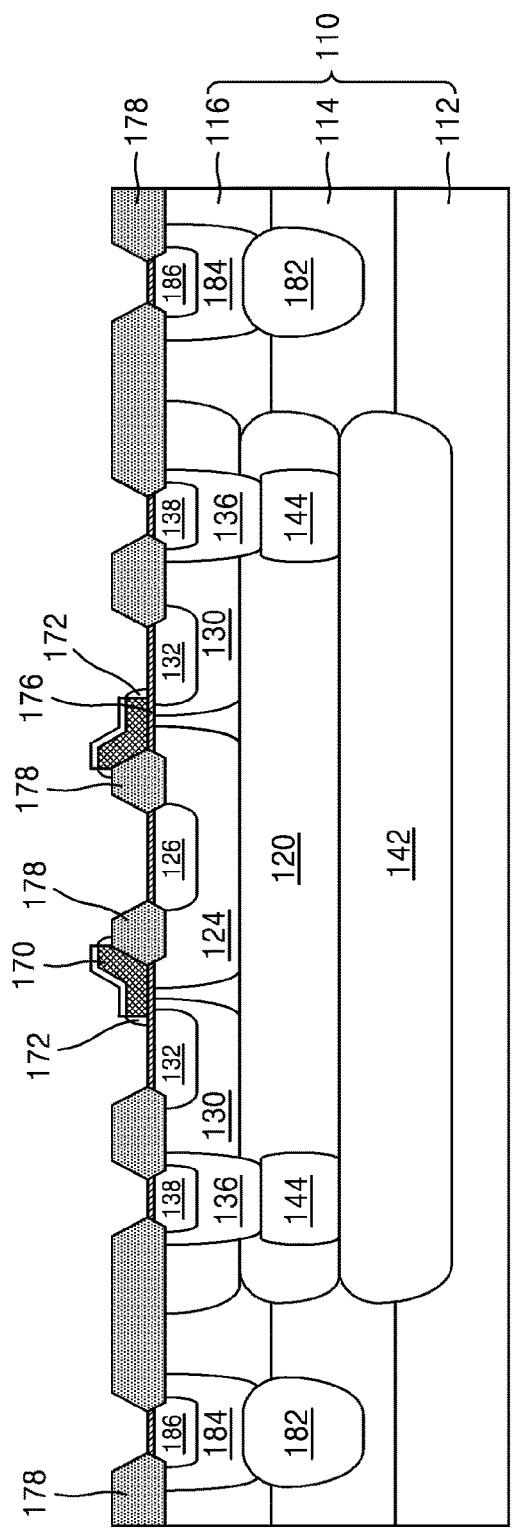

With reference to FIG. 14, after a conductive layer (not shown) is formed on a gate insulating layer 176 and a field oxide layer 178, the conductive layer is patterned, thereby forming a gate electrode 170. The gate electrode 170 may be formed using a conductive material such as polysilicon doped with an impurity, and the like by an electron beam evaporation method, a chemical vapor deposition method, a physical vapor deposition method, or the like. A first portion of the gate electrode 170 is located on the gate insulating layer 176, and a second portion of the gate electrode 170 is located on the field oxide layer 178. Thus, the gate electrode 170 may be formed to be conformal in order to traverse an edge portion of the field oxide layer 178 of the gate electrode 170.

After an insulating layer (not shown) is formed on a gate electrode 170, a field oxide layer 178, and a gate electrode 170, an anisotropic etching process is performed in an upper portion of the insulating layer, thereby forming a gate spacer 172 on a sidewall of the gate electrode 170. The gate spacer 172 may be formed using an insulation material such as silicon oxide, silicon nitride, silicon oxynitride, and the like.

Thereafter, the exposed portions of the gate insulating layer 176 are removed, thereby exposing a surface of the second semiconductor layer 116 again.

According to exemplary embodiments of the present disclosure, a process of removing portions of the gate insulating layer 176 may be performed together in the anisotropic etching process for formation of the gate spacer 172, and may be performed separately from the anisotropic etching process.

Meanwhile, in the removal process, portions of the gate insulating layer 176 disposed below the gate electrode 170 and the gate spacer 172 may not be removed, but may remain.

Figure 15:
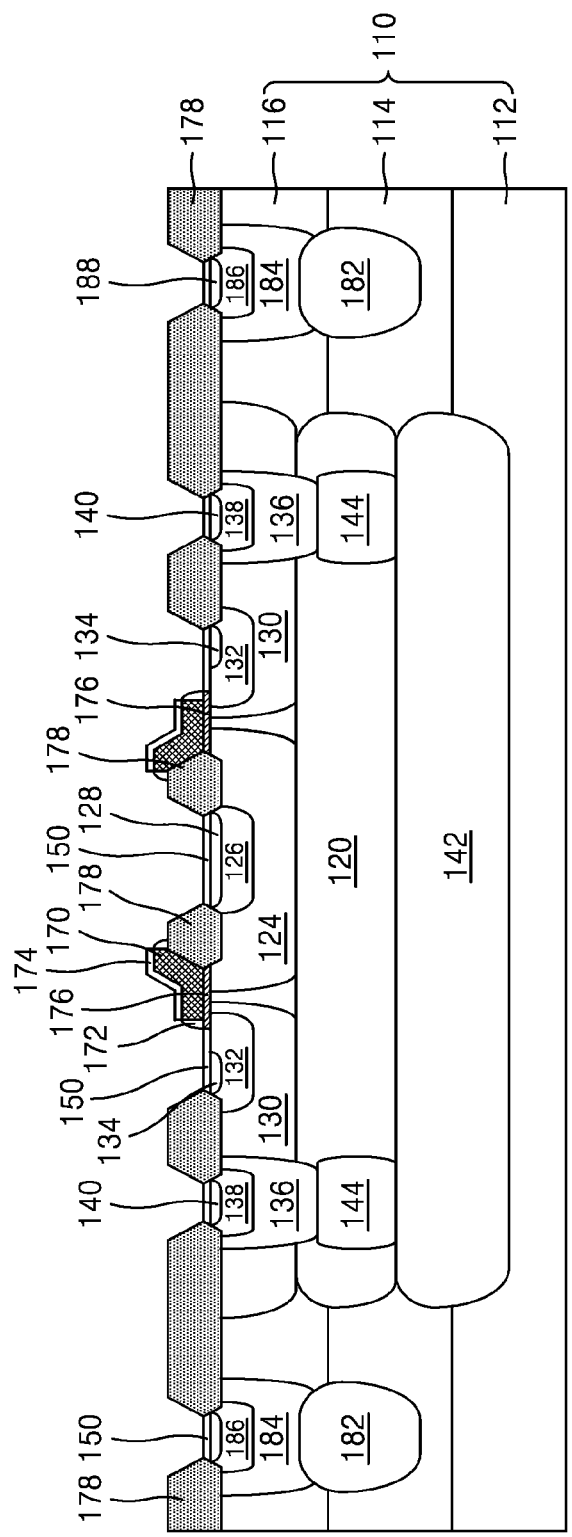

With reference to FIG. 15, after an eleventh photoresist pattern (not shown) in which an upper portion of a p-type well 126 and a ground region 186 is exposed, is formed on a second semiconductor layer 116, an eleventh ion implantation process is performed by using the eleventh photoresist pattern and a field oxide layer 178 as an ion implantation mask to inject p-type impurity ions inside the second semiconductor layer 116, thereby forming a p+ region 128 in an upper portion of the p-type well 126 and a p+ region 188 in an upper portion of the ground region 186. According to exemplary embodiments of the present disclosure, the p+ regions 128 and 188 may have an impurity concentration of about 1E18 to 5E21 $cm^{-3}$, but the impurity concentration of the p+ regions 128 and 188 is not limited thereto.

After a twelfth photoresist pattern (not shown) in which an upper portion of a gate electrode 170, an n-type well 132, and a lateral n-type well 138 is exposed, is formed on the second semiconductor layer 116, a twelfth ion implantation process is performed by using the twelfth photoresist pattern, the gate electrode 170, and the field oxide layer 178 as an ion implantation mask to inject n-type impurity ions inside the second semiconductor layer 116, thereby forming an n+ region 134 in an upper portion of the n-type well 132 and an n+ region 140 in an upper portion of the lateral n-type well 138. According to exemplary embodiments of the present disclosure, the n+ regions 134 and 140 may have an impurity concentration of about 1E18 to 5E21 $cm^{-3}$, but the impurity concentration of the n+ regions 134 and 140 is not limited thereto.

Thereafter, a silicide layer 150 and a gate silicide layer 174 may be formed on the exposed second semiconductor layer 116 and the exposed gate electrode 170. For example, the silicide layer 150 and the gate silicide layer 174 may be formed by using cobalt silicide, tungsten silicide, nickel silicide, tantalum silicide, and the like.

According to exemplary embodiments of the present disclosure, the silicide layer 150 and the gate silicide layer 174 may be formed in the same process. According to another exemplary embodiment, the silicide layer 150 and the gate silicide layer 174 may be formed in different processes.

Figure 16:
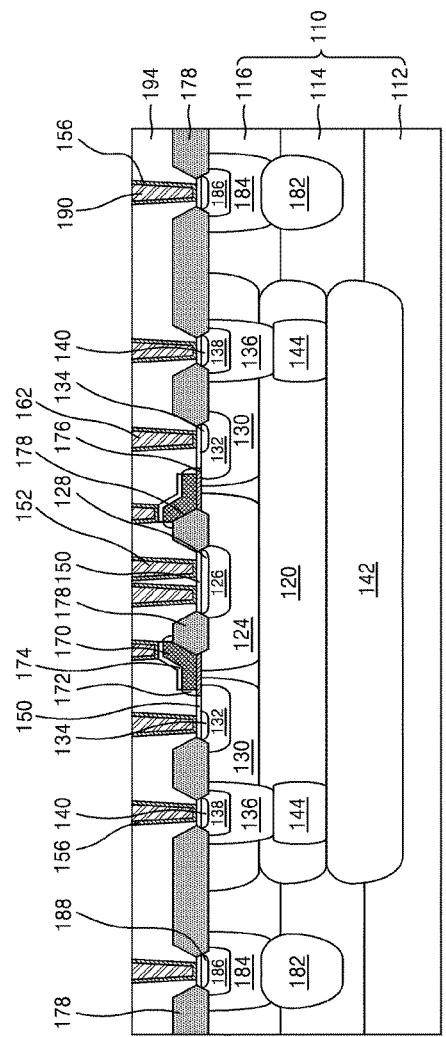

With reference to FIG. 16, an upper insulating layer 194 may be formed on a field oxide layer 178.

Hereafter, as an upper insulating layer 194 is patterned, a cathode contact hole (not shown) in which a portion of a silicide layer 150 on the n+ regions 134 and 140, and a portion of a gate silicide layer 174 on the gate electrode 170 are exposed, may be formed, and an anode contact hole (not shown) in which a portion of a silicide layer 150 on the p+ region 128 and a ground contact hole (not shown) in which a portion of a silicide layer 150 on the p+ region 188 is exposed, may be formed.

A diffusion barrier layer 156 may be formed at a predetermined thickness on an upper insulating layer 194. The diffusion barrier layer 156 may be formed to be conformal on an inner wall of the anode contact hole, the cathode contact hole, and the ground contact hole. The diffusion barrier layer 156 may serve as a barrier preventing the unnecessary reaction between the silicide layer 150 and the gate silicide layer 174, and contact plugs 152, 162, and 190, which will be formed inside the anode contact hole, the cathode contact hole, and the ground contact hole, respectively, in a following process.

Thereafter, after a conductive layer (not shown) with which the anode contact hole, the cathode contact hole, and the ground contact hole are filled, is formed on the diffusion barrier layer 156, an upper portion of the conductive layer is planarized. Thus, an anode contact plug 152, a cathode contact plug 162, and a ground contact plug 190 may be formed inside the anode contact hole, the cathode contact hole, and the ground contact hole, respectively.

With reference to FIG. 2 again, after a conductive layer (not shown) is formed on an upper insulating layer 194, the conductive layer is patterned, thereby forming an anode electrode 154, a cathode electrode 164, and a ground electrode 192 in contact with an anode contact plug 152, a cathode contact plug 162, and a ground contact plug 190, respectively.

The above described processes are performed, thereby completing a power semiconductor device 1000 according to exemplary embodiments.

While exemplary embodiments have been shown and described above, it will be apparent to those skilled in the art that modifications and variations could be made without departing from the scope of the present disclosure as defined by the appended claims.

What is claimed is:

1. A power semiconductor device comprising:
   a substrate;
   an anode electrode;
   a cathode electrode;
   a well region disposed inside the substrate below the anode electrode, and having a p-type conductivity;
   an NISO region disposed below the well region, and having a first n-type impurity concentration, inside the substrate; and
   an n-type buried layer disposed below the NISO region and having a second n-type impurity concentration greater than the first n-type impurity concentration, inside the substrate,
   the n-type buried layer being below substantially an entirety of the NISO region.

2. The power semiconductor device of claim 1, wherein the well region and the NISO region define a p-n junction diode.

3. The power semiconductor device of claim 1, wherein at least a portion of a bottom surface of the NISO region is in contact with an upper surface of the n-type buried layer.

4. A power semiconductor device, comprising:
   a substrate;
   an anode electrode;
   a cathode electrode;
   a well region disposed inside the substrate below the anode electrode, and having p-type conductivity;
   an NISO region disposed below the well region, and having a first n-type impurity concentration, inside the substrate;
   an n-type buried layer disposed below the NISO region, and having a second impurity concentration greater than the first n-type impurity concentration; and
   an n-type barrier layer disposed on a side of the NISO region, inside the substrate.

5. The power semiconductor device of claim 4, wherein the n-type barrier layer is disposed on the n-type buried layer.

6. The power semiconductor device of claim 4, wherein at least a portion of a bottom surface of the n-type barrier layer is in contact with an upper surface of the n-type buried layer.

7. The power semiconductor device of claim 4, wherein the n-type barrier layer has a third n-type impurity concentration greater than the first n-type impurity concentration.

8. The power semiconductor device of claim 4, further comprising an n-type sink disposed on the n-type barrier layer, inside the substrate,
   the n-type sink having a third n-type impurity concentration greater than the first n-type impurity concentration.

9. The power semiconductor device of claim 4, further comprising an element isolation region disposed on one side of the NISO region, inside the substrate,
   the element isolation region including an upper element isolation layer and a lower element isolation layer disposed below the upper element isolation layer.

10. The power semiconductor device of claim 9, wherein a bottom surface of the lower element isolation layer is located at a higher level than a bottom surface of the n-type buried layer.

11. A power semiconductor device, comprising:
    a base substrate;
    a first semiconductor layer disposed on the base substrate;
    a second semiconductor layer disposed on the first semiconductor layer;
    an anode electrode and a cathode electrode disposed on the second semiconductor layer;
    a p-type well region disposed below the anode electrode inside the second semiconductor layer;
    an NISO region disposed below the p-type well, and in which at least a portion is located inside the first semiconductor layer;
    an n-type buried layer disposed below the NISO region, and in which at least a portion is located inside the base substrate; and
    an element isolation region disposed on a side of the NISO region, the element isolation region including:
       a lower element isolation layer having at least a portion located inside the first semiconductor layer, and
       an upper element isolation layer having at least a portion located inside the second semiconductor layer and on the lower element isolation layer.

12. The power semiconductor device of claim 11, wherein the NISO region has a first n-type impurity concentration, and the n-type buried layer has a second n-type impurity concentration greater than the first n-type impurity concentration.

13. The power semiconductor device of claim 11, further comprising an n-type barrier layer disposed on one side of the NISO region and disposed on the n-type buried layer.

14. The power semiconductor device of claim 13, wherein the NISO region has a first n-type impurity concentration, and the n-type barrier layer has a second n-type impurity concentration greater than the first n-type impurity concentration.

15. A power semiconductor device comprising:
a substrate; and
a plurality of unit cells disposed on the substrate, each of the plurality of unit cells including:
an anode electrode and a cathode electrode disposed at a distance away from each other on the substrate,
a well region disposed inside the substrate below the anode electrode, and having p-type conductivity; and
an NISO region disposed below the well region, and having a first n-type impurity concentration inside the substrate; and
an n-type buried layer disposed below the NISO region of each of the plurality of unit cells and having a second n-type impurity concentration greater than the first n-type impurity concentration inside the substrate,
the n-type buried layer overlapping with substantially an entire area of the plurality of unit cells.

16. The power semiconductor device of claim 15, wherein the cathode electrode inside one unit cell among the plurality of unit cells is connected to the cathode electrode inside a unit cell adjacent thereto.

17. The power semiconductor device of claim 15, wherein each of the plurality of unit cells further includes an n-type barrier layer disposed on both sides of the NISO region.

18. The power semiconductor device of claim 4, wherein at least a portion of a bottom surface of the NISO region is in contact with an upper surface of the n-type buried layer.

19. The power semiconductor device of claim 4, wherein the n-type buried layer is below substantially an entirety of the NISO region.

20. The power semiconductor device of claim 4, further comprising an n-type barrier layer disposed on a side of the NISO region.

* * * * *